(12) United States Patent
Hurwitz et al.

(10) Patent No.: US 9,305,699 B2
(45) Date of Patent: *Apr. 5, 2016

(54) TRANSFORMER DRIVER CIRCUIT WITH IC PROTECTION CIRCUITRY

(71) Applicant: BROADCOM EUROPE LIMITED, London (GB)

(72) Inventors: Jonathan Ephraim David Hurwitz, Edinburgh (GB); Seyed Danesh, Edinburgh (GB); Steven Maughan, Edinburgh (GB)

(73) Assignee: Broadcom Europe Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/673,736

(22) Filed: Mar. 30, 2015

(65) Prior Publication Data

US 2015/0206651 A1  Jul. 23, 2015

Related U.S. Application Data

(63) Continuation of application No. 13/515,464, filed as application No. PCT/GB2010/052132 on Dec. 17, 2010, now Pat. No. 9,001,534.

(30) Foreign Application Priority Data

Dec. 22, 2009  (GB) .................................. 0922381.9

(51) Int. Cl.
| | |
|---|---|
| *H01F 38/00* | (2006.01) |
| *H03F 3/217* | (2006.01) |
| *H03K 17/691* | (2006.01) |
| *G01R 19/00* | (2006.01) |

(52) U.S. Cl.
CPC ................ *H01F 38/00* (2013.01); *H03F 3/217* (2013.01); *H03K 17/691* (2013.01); *G01R 19/0092* (2013.01); *H03F 2200/273* (2013.01); *H03F 2200/541* (2013.01)

(58) Field of Classification Search
CPC ..................................................... H03F 3/217
USPC ............ 363/24, 25, 56.04, 97, 134, 153, 171; 323/328, 337, 355
See application file for complete search history.

(56) References Cited

U.S. PATENT DOCUMENTS

| | | | | | |
|---|---|---|---|---|---|
| 4,030,015 | A | * | 6/1977 | Herko et al. ..................... | 363/16 |
| 4,052,659 | A | * | 10/1977 | Fletcher et al. ................. | 363/57 |
| 4,095,128 | A | * | 6/1978 | Tanigaki ........................ | 327/412 |
| 4,155,113 | A | * | 5/1979 | Simmons ........................ | 363/24 |
| 4,293,902 | A | * | 10/1981 | White ............................. | 363/26 |

(Continued)

*Primary Examiner* — Timothy J Dole
*Assistant Examiner* — Yusef Ahmed
(74) *Attorney, Agent, or Firm* — Garlick & Markison; Bruce E. Garlick

(57) ABSTRACT

A transformer driver circuit couples to a transformer having a primary winding, a secondary winding, and a transformer tap that is connected to a first voltage source. The primary winding electrically connects at its ends to respective unipolar controllable current sinks that form part of an integrated circuit. The transformer driver circuit operates by each current sink selectively sinking current from the end of the primary winding to which it is connected so as to cause current to flow in the secondary winding in a push-pull fashion. The transformer driver circuit further includes a load electrically connected to the secondary winding and protection circuitry operative to protect the integrated circuit from input levels greater than it can withstand.

20 Claims, 9 Drawing Sheets

(56) References Cited

U.S. PATENT DOCUMENTS

| | | | | |
|---|---|---|---|---|
| 4,553,039 A * | 11/1985 | Stifter | | 307/66 |
| 4,605,997 A * | 8/1986 | Kirk | | 363/16 |
| 4,764,717 A * | 8/1988 | Tucker et al. | | 323/364 |
| 4,797,803 A * | 1/1989 | Carroll | | 363/95 |
| 5,907,481 A * | 5/1999 | Svardsjo | | 363/25 |
| 5,929,776 A * | 7/1999 | Warble et al. | | 340/7.32 |
| 6,040,662 A * | 3/2000 | Asayama | | 315/291 |
| 6,275,391 B1 * | 8/2001 | Laskai et al. | | 363/24 |
| 7,218,541 B2 * | 5/2007 | Price et al. | | 363/134 |
| 7,423,891 B2 * | 9/2008 | Ho et al. | | 363/26 |
| 7,835,164 B2 * | 11/2010 | Lyle, Jr. | | 363/24 |
| 2002/0154517 A1 * | 10/2002 | Chutjian et al. | | 363/13 |
| 2004/0257834 A1 * | 12/2004 | Kazem | | 363/16 |
| 2005/0047175 A1 * | 3/2005 | Kawasaki et al. | | 363/16 |
| 2005/0128775 A1 * | 6/2005 | Fukumoto | | 363/65 |
| 2006/0120117 A1 * | 6/2006 | Toda et al. | | 363/24 |
| 2007/0075700 A1 * | 4/2007 | Nakahori | | 323/355 |
| 2007/0194831 A1 * | 8/2007 | Ochi et al. | | 327/379 |
| 2007/0291523 A1 * | 12/2007 | Fukumoto et al. | | 363/134 |
| 2008/0055945 A1 * | 3/2008 | Chan et al. | | 363/24 |
| 2008/0309305 A1 * | 12/2008 | Atmur | | 323/301 |

* cited by examiner

TRANSFORMER DRIVER CIRCUIT WITH IC PROTECTION CIRCUITRY

CROSS REFERENCE TO RELATED PATENTS/PATENT APPLICATIONS

The present U.S. Utility Patent Application claims priority pursuant to 35 U.S.C. §120 as a continuation of U.S. Utility application Ser. No. 13/515,464, entitled "Transformer Driver Circuit with IC Protection Circuitry," filed Jun. 26, 2012, which is the national stage entry under 35 USC 371(c) of PCT/GB2010/052132, filed Dec. 17, 2010, entitled "Current Measuring Apparatus," which claims priority to GB0922381.9 filed Dec. 22, 2009, entitled "Current Measuring Apparatus," all of which are hereby incorporated herein by reference in their entirety and made part of the present U.S. Utility Patent Application for all purposes.

FIELD OF THE INVENTION

The present disclosure relates to a transformer driver circuit and in particular but not exclusively networking apparatus comprising such a transformer driver circuit.

BACKGROUND TO THE INVENTION

A known transformer driver, in this case a Class-D amplifier, 10 is shown in FIG. 1A. The Class-D amplifier makes use of a P/N totem pole H-bridge configuration of transistors 12, 14, 16, and 18 to drive two load terminals 20, 22 to alternate supply voltages in an active fashion. In FIG. 1A the alternate supply voltages are ground and VDD. The voltage between the load terminals 20, 22 is applied to an inductor 24 of an LC filter by way of a transformer 26 to induce current flow in the inductor in accordance with I=(1/L)*integral(Vout−Vfilt_out), where L is the inductance of the inductor, Vout is the voltage across the secondary winding of the transformer and Vfilt_out is the voltage across the capacitor 28 of the LC filter. A resistive load 30 is present at the output of the LC filter. The induced current flow is drawn through the transformer from whichever supply, i.e. ground or VDD, is presently driving the output. Thus energy is transferred from the supply to the inductor 24 as is shown in FIG. 1B or from the inductor back to the supply as is shown in FIG. 1C depending on the direction of the load current. The components in FIGS. 1B and 1C have the same reference numerals as the corresponding components in FIG. 1A. Assuming the transistors 12, 14, 16, and 18 to be performing as ideal switches and an ideal inductor, capacitor and resistor, the only energy loss is that which results from the ripple voltage present across the load resistor 30.

Where an increase in injected power is required, the load resistance 30 is reduced. However, at some point during the course of reducing the load resistance the parasitic resistances in the circuit become significant compared to the load resistance and efficiency decreases rapidly. The parasitic resistances are present as transistor on-state resistance and parasitic series resistance in the LC filter and the transformer. If the load resistance is further reduced it becomes impossible to achieve the required injected power because the parasitic resistances are too large.

It is an object of the disclosure to address one or more of the above issues and provide a transformer driver of acceptable efficiency and able to provide for increased injection of power between a primary winding and a secondary winding of the transformer to handle increased output power.

BRIEF DESCRIPTION OF DRAWINGS

Further features and advantages of the present disclosure will become apparent from the following specific description, which is given by way of example only and with reference to the accompanying drawings, in which.

DETAILED DESCRIPTION

A bipolar output stage can generate more power than a unipolar output stage for the same supply voltage. However, a unipolar output stage can be adapted to higher output voltages more easily than a bipolar output stage. Therefore, to achieve high output power, it is proposed to combine these ideas by using two unipolar sources to provide a bi-polar output signal. The unipolar sources are unipolar current sources, and may be made using a variety of implementations, including approaches such as Class-D outputs, or multi-level current-drive circuits such as transconductor amplifiers or digital-to-analog converters.

Figure 2A:
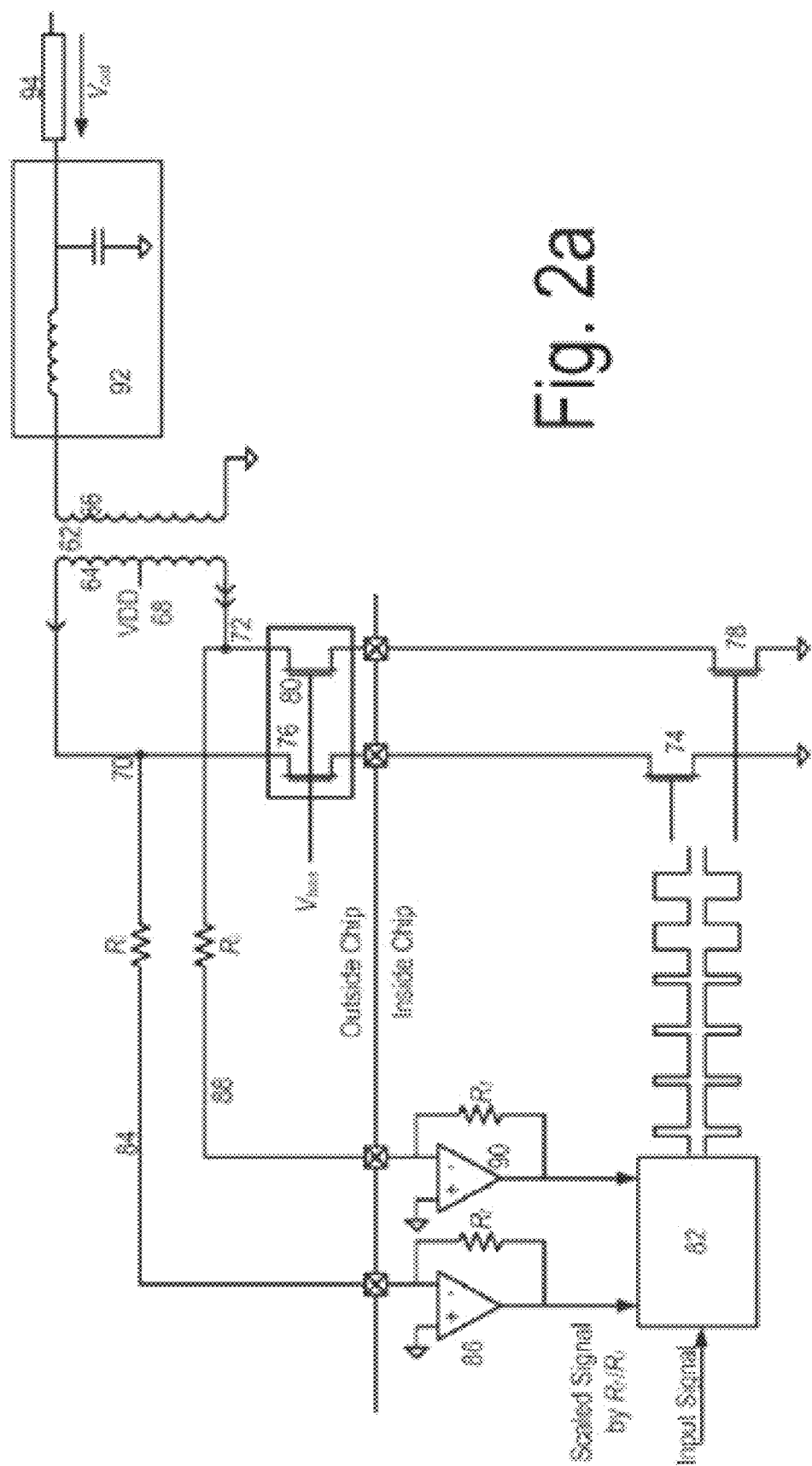
FIG. 2A is a first embodiment of the present disclosure.

FIG. 2A shows a first embodiment of the present disclosure, using a switched class (Class D) transformer driver circuit 60. The transformer driver circuit 60 comprises a transformer 62 comprising a primary winding 64 and a secondary winding 66. The primary winding 64 comprises a centre tap 68 (which constitutes a transformer tap) and first 70 and second 72 ends. The first end 70 of the primary winding is electrically connected to a first current source 74 by way of a first series connected protection circuit 76. The second end 72 of the primary winding is electrically connected to a second current source 78 by way of a second series connected protection circuit 80. The center tap 68 is connected to a high voltage supply, which in a first form is an integrated circuit high voltage supply and in a second form is of a higher voltage level than the integrated circuit high voltage supply. Each of the first and second current sources 74, 78 is constituted as a MOS transistor, which is driven by an output signal from a modulator circuit 82. Each of the first and second protection circuits 76, 80 is constituted as a MOS transistor with its gate voltage maintained at a bias voltage determined such that a voltage across the associated current source does not exceed a safe operative limit. A first feedback path 84 conveys a first feedback signal from the first end 70 of the primary winding to the modulator circuit 82 by way of a first operational amplifier attenuator 86. An input resistance and a feedback resistance of the first operational amplifier attenuator 86 are selected to reduce the voltage swing of the first feedback signal to an acceptable level for the modulator circuit. A second feedback path 88 conveys a second feedback signal from the second end 72 of the primary winding to the modulator circuit 82 by way of a second operational amplifier attenuator 90. An input resistance and a feedback resistance of the second operational amplifier attenuator 90 are selected to reduce the voltage swing of the second feedback signal to an acceptable level for the modulator circuit. An LC filter 92 is provided at an output of the secondary winding 66 with a load 94 (e.g. the communications medium 140 described below with reference to FIG. 6) being present at the output of the LC filter. The first and second current sources 74, 78, the modulator circuit 82 and the first and second operational amplifier attenuators 86, 90 with the exception of the input resistors form part of a low voltage CMOS integrated circuit. The remaining components of the circuit of FIG. 2A are external to the integrated circuit.

In use, the modulator circuit 82 alternately operates the first 74 and second 78 current sources by means of digital control signals. When the first current source 74 is operated, the first end 70 of the primary winding is electrically connected to the low voltage supply. Hence, a current flows from the centre tap 68 to the first end 70 of the primary winding in a first direction, which is indicated by the single arrow in FIG. 2A. When the second current source 78 is operated, the second end 72 of the primary winding is electrically connected to the low voltage supply. Hence, a current flows from the centre tap 68 to the second end 72 of the primary winding in a second direction opposite the first direction; the second direction is indicated by the double arrow in FIG. 2A. It should be appreciated that energy can be transferred to and fro between the primary winding 64 and the secondary winding 66, and therefore between the load and power supply, the actual direction of transfer at any one time depending on factors such as the voltage/current flows at that particular time and the load characteristics (an inductive load is required for energy to flow back to the supply).

Figure 1A:
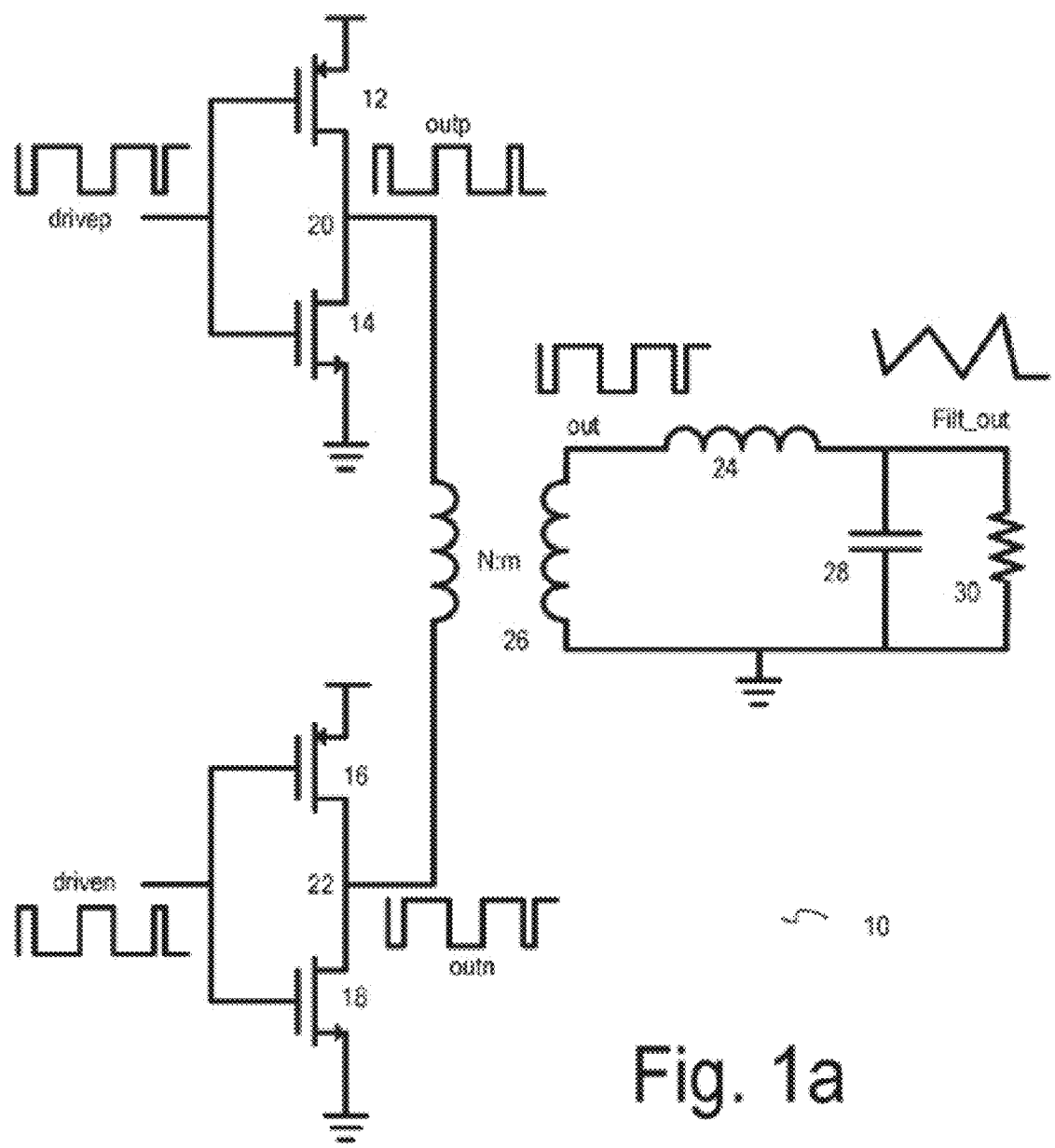
FIG. 1A is a circuit diagram of a known Class-D amplifier.
Figure 1B:
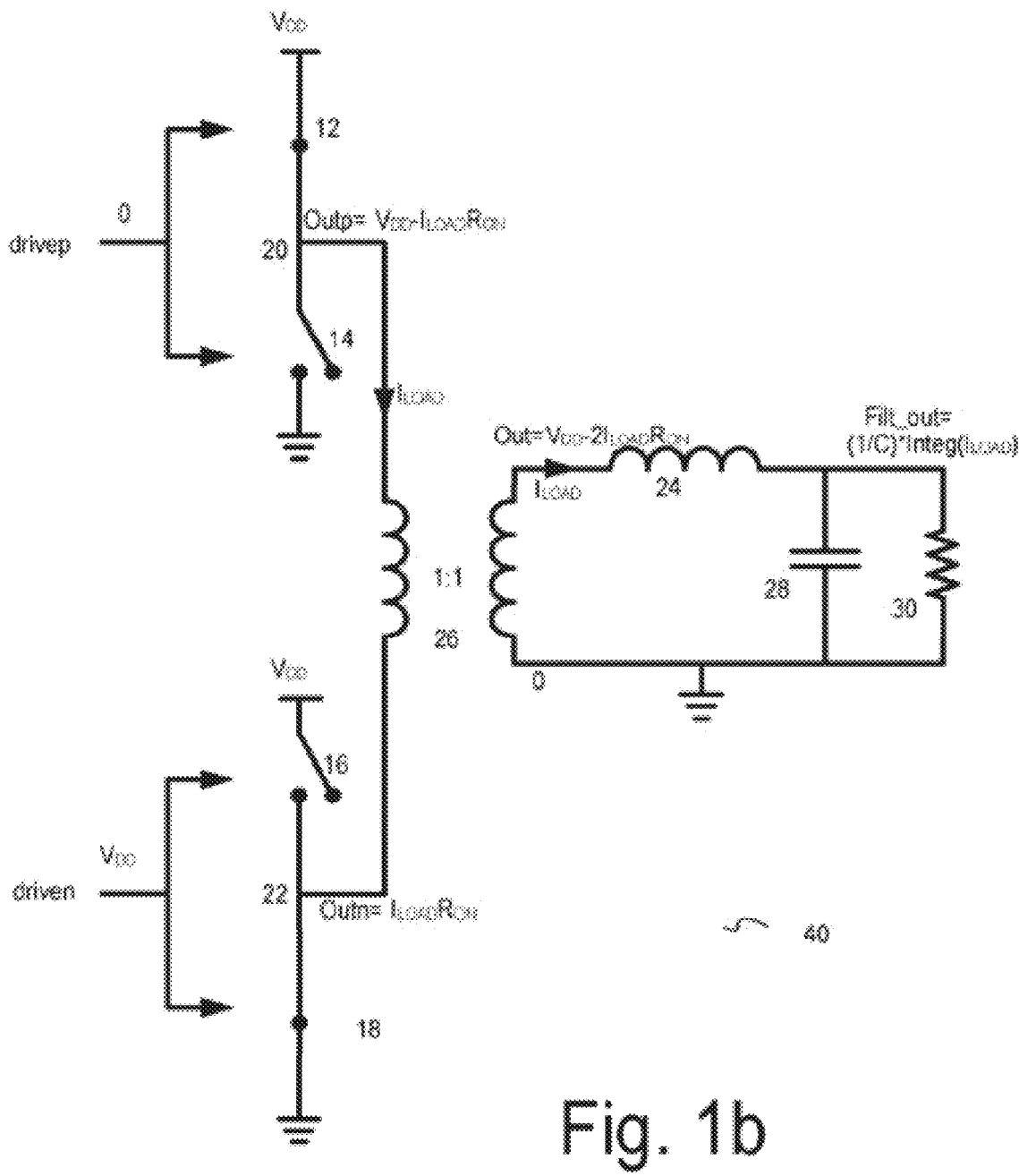
FIG. 1B represents the circuit of FIG. 1A when energy flows from the supply to the inductor.
Figure 1C:
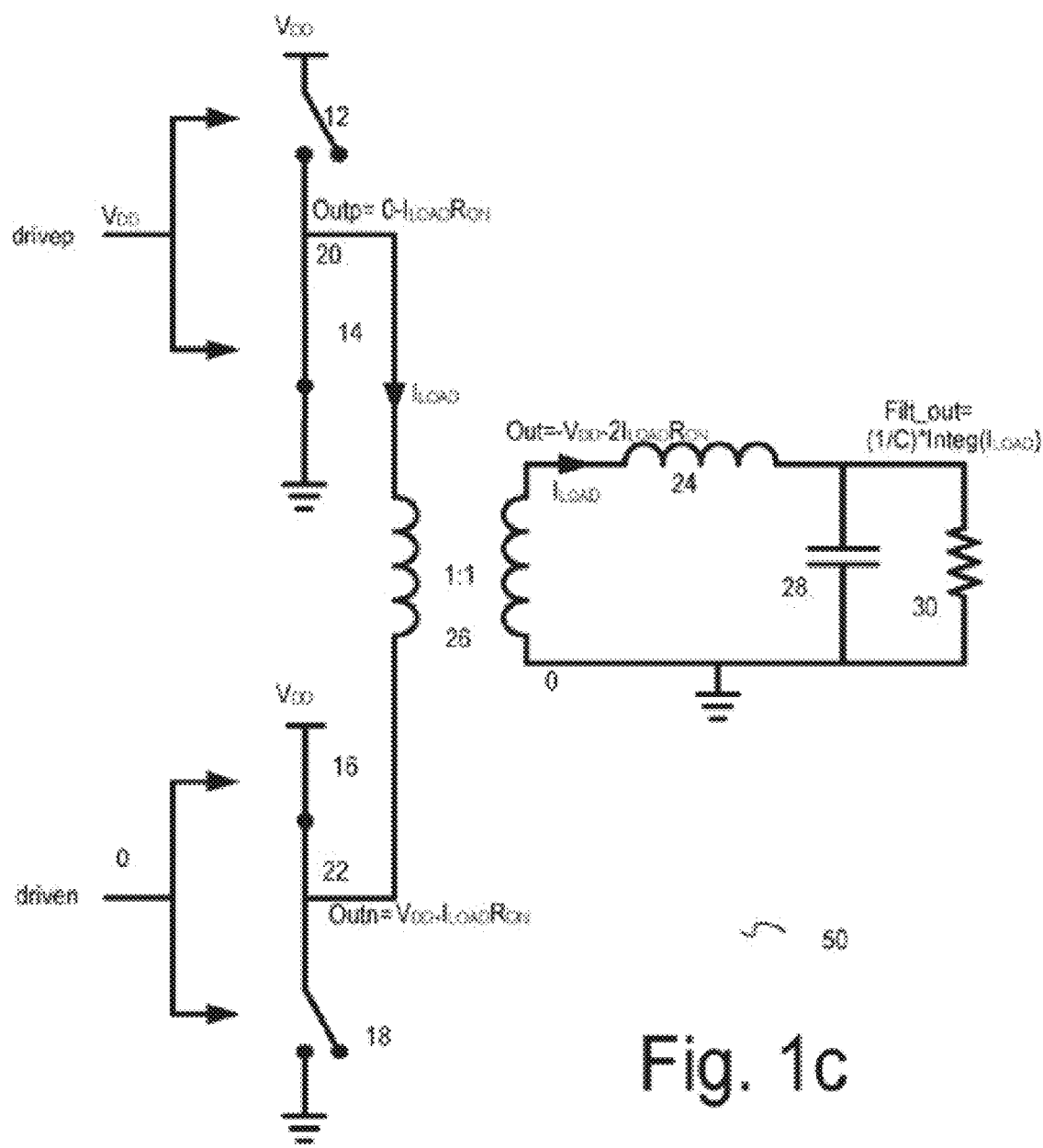
FIG. 1C represents the circuit of FIG. 1A when energy flows from the inductor to the supply.

With a centre-tap voltage higher than the on-chip voltage, the circuit of FIG. 2A is capable of injecting a higher level of power than the circuit of FIG. 1A before encountering a roll-off in efficiency. The feedback circuitry provides for a reduction in the output signals from the modulator circuit 82 to thereby compensate for signals in the transformer-current source circuitry that are liable to cause saturation and to thereby cause distortion. Such saturation causing signals are liable to arise where the load is unknown or the load varies where the circuit of FIG. 2A is used in certain applications, such as in multi-media networking in residential or commercial premises as is described below with reference to FIG. 6.

Figure 2B:
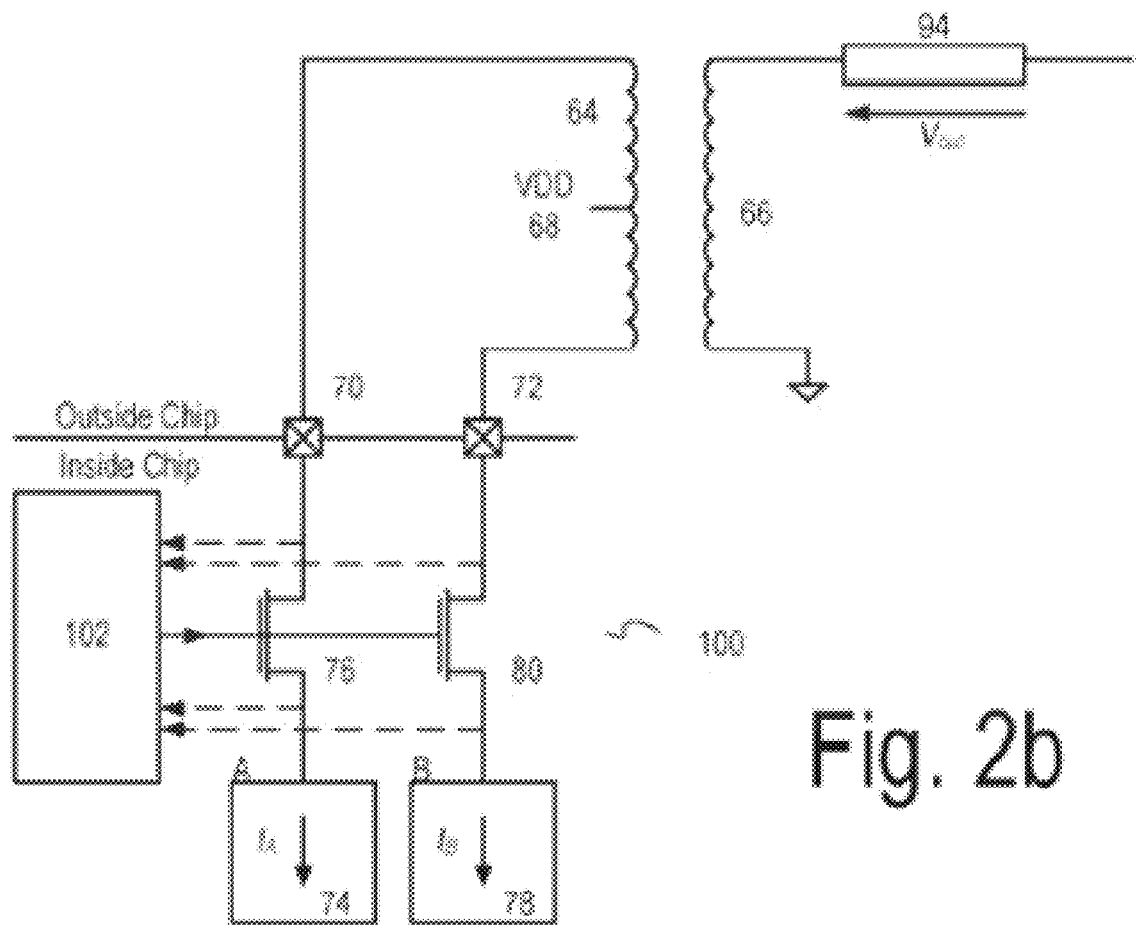
FIG. 2B is an alternative form of protection circuit for the first embodiment.

FIG. 2B shows an alternative form of protection circuit 100, which is used when the protection circuits form part of the integrated circuit. Components in common with the circuit of FIG. 2A are indicated by like reference numerals. The protection circuit 100 of FIG. 2B comprises the first and second MOS transistors 76, 80 and an adaptive biasing circuit 102. The adaptive biasing circuit is operative to vary the gate voltage of each of the first and second MOS transistors 76, 80 in dependence on the voltages at the sources and drains of the first and second MOS transistors 76, 80. Thus, the adaptive biasing circuit is operative to keep the voltage across each of the current sources 74, 78 and the first and second MOS transistors 76, 80 within tolerable limits. The design of an adaptive biasing circuit 102 will be within the ordinary design skills of the person skilled in the art.

Figure 3:
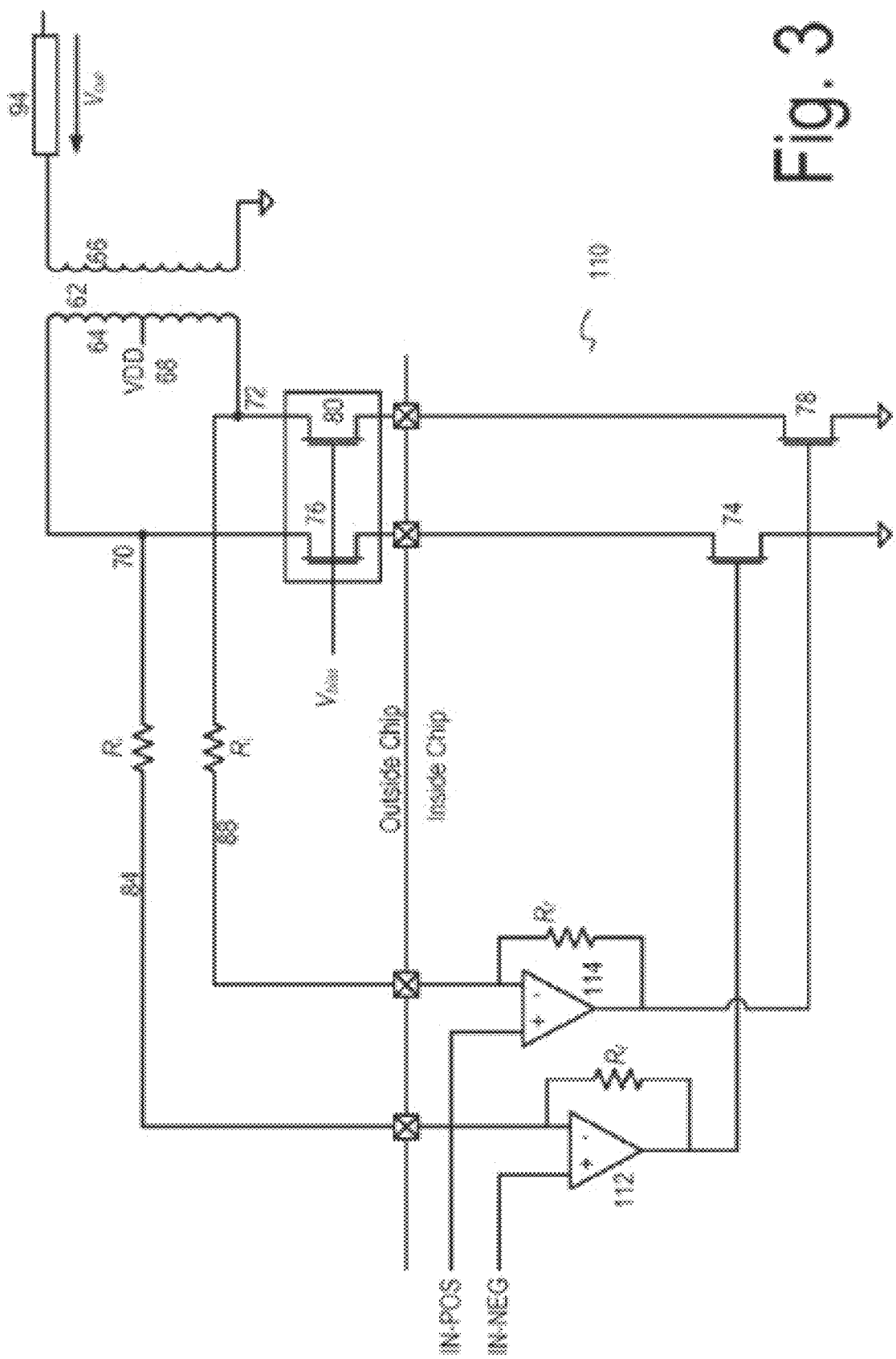
FIG. 3 is a second embodiment of the present disclosure.

A second embodiment of the present disclosure is shown in FIG. 3, namely a Class AB transformer driver circuit 110. Components in common with the circuit of FIG. 2A are indicated by like reference numerals and therefore the reader's attention is directed to the description for FIG. 2A with respect to such common components. The circuit of FIG. 3 operates in the same push-pull fashion as the circuit of FIG. 2A with the exception that the first and second current sources 74, 78 are operated by analogue drive signals so that the circuit operates in a linear fashion. Instead of the modulator circuit of the circuit of FIG. 2A, each of the two drive signals are received at respective non-inverting inputs of first 112 and second 114 operational amplifiers. The first 84 and second 88 feedback signals are received at respective inverting inputs of the first 112 and second 114 operational amplifiers. Each of the first 112 and second 114 operational amplifiers is configured as an attenuator with an input resistance and a feedback resistance selected to reduce the voltage swing of the feedback signal to an acceptable level for the integrated circuit. The outputs of the first 112 and second 114 operational amplifiers provide the drive signals for the first and second current sources 74, 78. Each operational amplifier adjusts its output voltage so that the inverting and non-inverting inputs are substantially equal. Hence, each operational amplifier adjusts the current sunk by the current source until the output at the load matches the input to the circuit.

Figure 4:
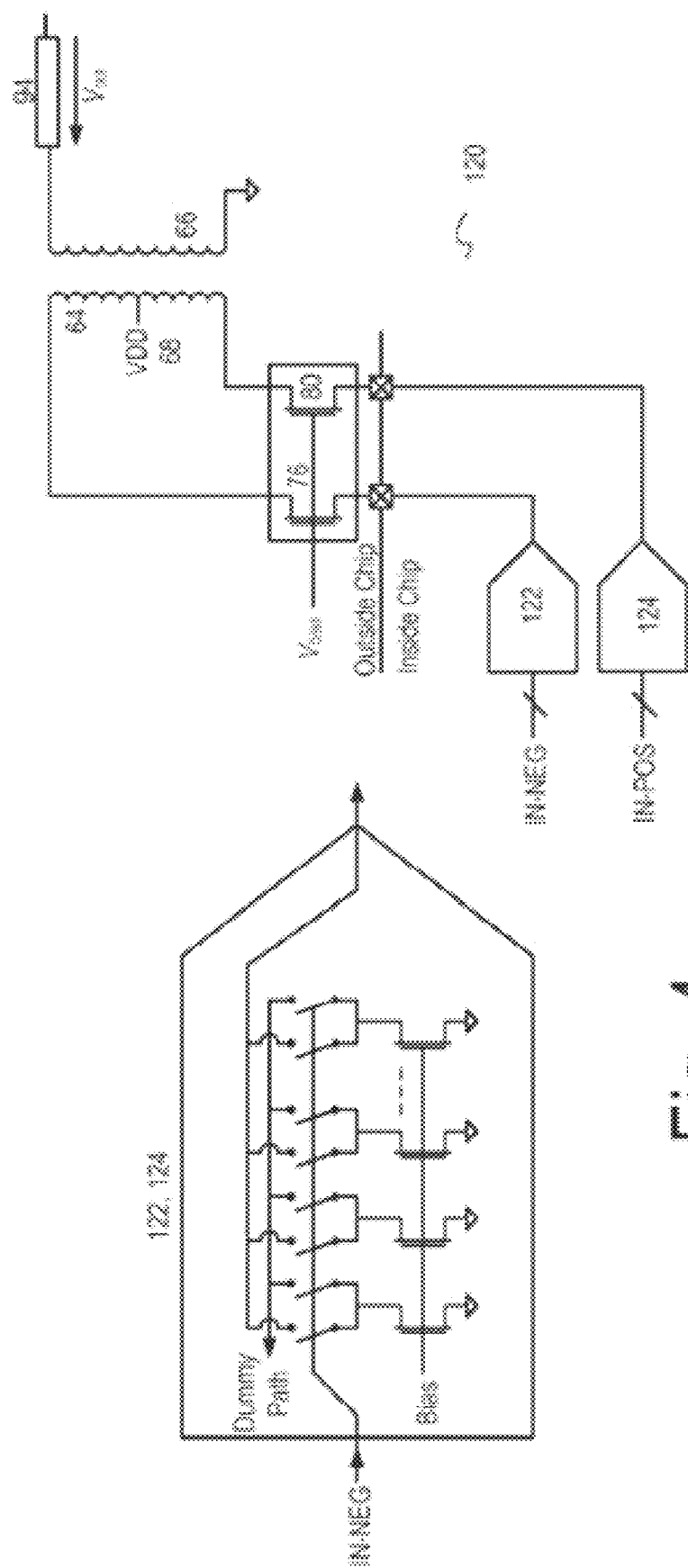
FIG. 4 is a third embodiment of the present disclosure.

A third embodiment of the present disclosure is shown in FIG. 4, namely a direct drive transformer driver circuit 120. Components in common with the circuit of FIG. 2A are indicated by like reference numerals and therefore the reader's attention is directed to the description for FIG. 2A with respect to such common components. The circuit of FIG. 3 comprises first 122 and second 124 current mode Digital to Analogue Converters (DACs) instead of the current sources shown in FIGS. 2A and 4. Each of the first 122 and second 124 current mode Digital to Analogue Converters provide for digitally controlled current sinking from its respective end of the primary winding 64. Each DAC 122, 124 may comprise the structure shown on the left of the Figure. A digital code input to each DAC provides for variation in the level of current sunk by the DAC. Hence, the circuit of FIG. 4 operates in the same push-pull fashion as the circuit of FIG. 2A. As can be seen, the circuit of FIG. 4 lacks the feedback circuitry of the circuits of FIGS. 2A and 4, although the circuit could be modified to provide for feedback. Such modification would be within the scope of the ordinary design skills of the person skilled in the art.

Figure 5:
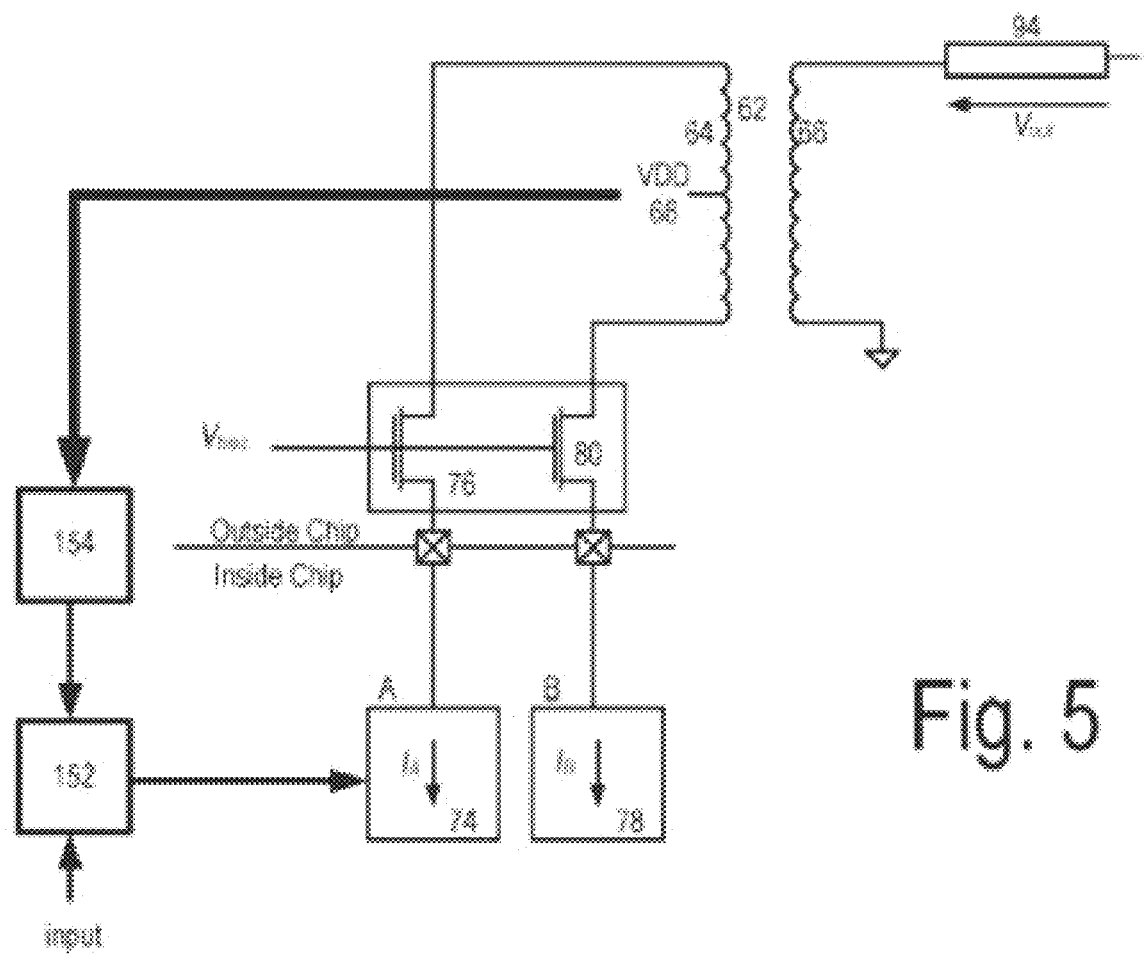
FIG. 5 is an embodiment of the present disclosure configured to determine an impedance at the output from the secondary winding.

FIG. 5 shows a non-switching transformer driver circuit 150, i.e. the embodiment of FIG. 3 or 4, which is configured to determine the impedance at the output from the secondary winding. Components in common with the circuit of FIG. 2A are indicated by like reference numerals and therefore the reader's attention is directed to the description for FIG. 2A with respect to such common components. The circuit of FIG. 5 comprises a gain control circuit 152 and an impedance monitoring circuit 154. In use, the transformer driver circuit is operative to source a known current by means of each of the first and second current sources and the impedance monitoring circuit 152 is operative to determine a voltage applied to the load 94 and to estimate an impedance of the load in dependence on the determined voltage and the current sourced by the first and second current sources, which are known. The impedance monitoring circuit 152 is then operative to change a gain of the gain control circuit 152 to thereby change the current sourced by the first and second current sources 74, 78 so that a desired or required amount of power is injected by the transformer driver circuit 150. Adjusting the current sourced by the first and second current sources 74, 78 in this fashion can prevent the transformer driver circuit from saturating and thereby causing distortion.

In another embodiment, which has the same components and configuration as the circuit shown in FIG. 5, the impedance monitoring circuit 154 is operative to measure a voltage signal across the load over a period of time, such as during a data frame, during ordinary use of the transformer driver circuit. The impedance monitoring circuit 154 is then operative to estimate an impedance of the load in dependence on the measured voltage and the current at the output from the secondary winding, which is known. The impedance monitoring circuit 152 is then operative to change a gain of the gain control circuit 152 to thereby change the current sourced by the first and second current sources 74, 78 so that a desired or required amount of power is injected by the transformer driver circuit 150. Adjusting the current sourced by the first and second current sources 74, 78 in this fashion can prevent the transformer driver circuit from saturating and thereby causing distortion. This approach is described in more detail in WO 2008/013857 (to the present applicant).

In an un-illustrated embodiment the gain of the gain control circuit 152 of FIG. 5 is adjusted in dependence on a quality measure made at the output from the secondary winding. More specifically, a signal at the output from the secondary winding is measured and analyzed by means of a Digital Signal Processor (DSP), which is operative to perform a Fast Fourier Transform (FFT) on the measured signal to determine a signal to noise ratio of the measured signal. If the determined signal to noise ratio is not at a desired or required level, the gain of the gain control circuit 152 is adjusted to change the current sourced by the first and second current sources 74, 78 to meet the desired or required level of signal to noise ratio.

Figure 6:
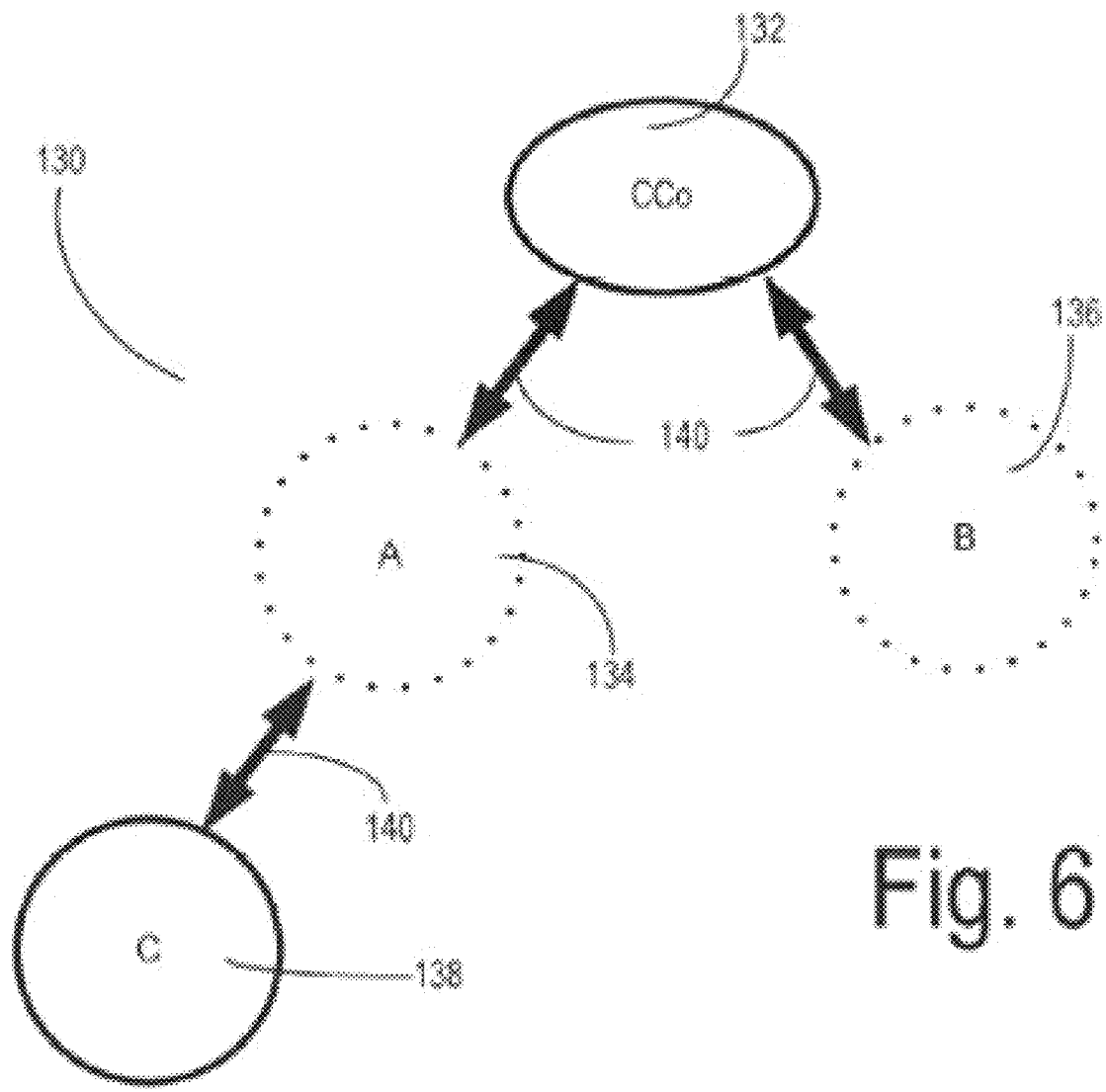
FIG. 6 is a representation of a network of consumer products in a building.

FIG. 6 shows a network 130 of consumer products in a building. The network comprises first 132, second 134, third 136 and fourth 138 nodes. Adjacent pairs of nodes are connected to each other by an already installed communications medium 140, such as mains power wiring, which provides for communication between and amongst a plurality of rooms in the residential building. Thus, for example, each of the first to fourth nodes may be located in a different room of the residential building. Each of the first to third nodes comprises a different multi-media device (which constitutes a consumer product). Thus, for example, the first node 132 comprises a Home Gateway (HGW), the second node 134 comprises Personal Computer (PC), the third node 136 comprises audio-visual entertainment apparatus and the fourth node 138 comprises network attached storage. In the network 130 of FIG. 6 the first node 132 is configured to operate as a communications controller, the second 134 and third 136 nodes are configured to operate as repeater nodes and the fourth node 138 is configured to operate as a standard network node. A communications controller controls the function of the network to which it belongs. Normally there is only one communications controller in a network. A standard node provides for communication of data from the branch of the communications medium leading to the node to the branch of communications medium leading from the node and for communication with the multi-media device connected to the node. A repeater node provides for communication of data from the branch of the communications medium leading to the node to the branch of communications medium leading from the node but provides for no communication with the multi-media device connected to the node, e.g. where the multi-media device is not being used. Referring to FIG. 6, the configuration of the nodes might be such that the HGW connected to the first node is streaming a film from an external source to the network and the NAS connected to the fourth node 138 might be saving the film. Network node apparatus is present at each of the first to fourth nodes 132, 134, 136, 138 of FIG. 6.

The network node apparatus of FIG. 6 comprises a home networking integrated circuit (a GGL541 from Gigle Networks Ltd of Capital House, 2 Festival Square, Edinburgh, EH3 9SU, UK) provided within an appropriate enclosure. Network node apparatus is operative to provide for communication with a consumer product by way of an Ethernet communications controller and with the other nodes in the network over at least one of mains power wiring, co-axial cable and phone line. Reference should be made to publicly available product data from the vendor of the GGL541; such product data provides sufficient information for the skilled person to implement the network shown in FIG. 6 without resorting to any more than ordinary design skill. A transformer driver circuit according to the present disclosure forms part of the home networking integrated circuit. More specifically, the transformer driver circuit is operative to drive the communications channel to the other nodes within the network. As described above, the transformer driver circuit of the present disclosure affords for increased power injection into the load be it in the form of mains power wiring, co-axial cable or phone line depending on the medium used for communication between and amongst nodes. The network of FIG. 6 may have communications channels of undetermined length and hence undetermined load resistance. Hence, it is advantageous to have the capability to regulate the transformer driver circuit to prevent its saturation as described above.

What is claimed is:

1. An integrated circuit formed inside a chip comprising:
   a first controllable current sink formed inside the chip having a first input and a first output, the first output located at a boundary of the chip and configured to drive a first end of a primary winding of a transformer that is located outside the chip;
   a second controllable current sink formed inside the chip having a second input and a second output, the second output located at a boundary of the chip and configured to drive a second end of the primary winding of the transformer that is located outside the chip;
   modulator circuitry formed inside the chip and configured to drive the first input of the first controllable current sink and drive the second input of the second controllable current sink based upon an input signal and limited by first and second feedback signals; and
   protection circuitry formed inside the chip and configured to produce the first and second feedback signals to limit operations of the first controllable current sink and the second controllable current sink to protect the chip from voltage levels greater than a protection voltage of the chip at the first output and the second output.

2. The integrated circuit of claim 1, wherein the transformer comprises a center tap that is electrically connected to a voltage of between two to five times greater than a supply voltage of the integrated circuit.

3. The integrated circuit of claim 1, wherein at least one of the first and second controllable current sinks comprises an active circuit.

4. The integrated circuit of claim 1, wherein the protection circuitry comprises:
   a first main protection circuit configured to connect in series between the first end of the primary winding of the transformer and the modulator circuitry; and
   a second main protection circuit configured to connect in series between the second end of the primary winding of the transformer and the modulator circuitry.

5. The integrated circuit of claim 4, wherein:
   the first main protection circuit comprises a first attenuator having a first input configured to couple to the first end of the primary winding and a second input coupled to a first reference voltage; and
   the second main protection circuit comprises a second attenuator having a first input configured to couple to the second end of the primary winding and a second input coupled to a second reference voltage.

6. The integrated circuit of claim 5, wherein the first reference voltage comprises one of:
a same voltage as the second reference voltage; or
a different voltage than the second reference voltage.

7. The integrated circuit of claim 1, wherein:
the first controllable current sink comprises a first transistor; and
the second controllable current sink comprises a second transistor.

8. The integrated circuit of claim 1, wherein the modulator circuitry is configured so that only one of the first controllable current sink and the second controllable current sink sinks current at any time.

9. An integrated circuit formed inside a chip comprising:
a first controllable current sink formed inside the chip having a first input and a first output, the first output located at a boundary of the chip and configured to drive a first end of a primary winding of a transformer that is located outside the chip;
a second controllable current sink formed inside the chip having a second input and a second output, the second output located at a boundary of the chip and configured to drive a second end of the primary winding of the transformer that is located outside the chip;
a first main protection circuit formed inside the chip and configured to connect in series between the first end of the primary winding of the transformer and the first input of the first controllable current sink; and
a second main protection circuit formed inside the chip and configured to connect in series between the second end of the primary winding of the transformer and the second input of the second controllable current sink,
wherein the first and second main protection circuits are configured to limit operations of the first controllable current sink and the second controllable current sink to protect the chip from voltage levels greater than a protection voltage of the chip at the first and second output.

10. The integrated circuit of claim 9, wherein the transformer comprises a center tap that is electrically connected to a voltage of between two to five times greater than a supply voltage of the integrated circuit.

11. The integrated circuit of claim 9, wherein at least one of the first and second controllable current sinks comprises an active circuit.

12. The integrated circuit of claim 9, wherein an input signal that drives the first controllable current sink and the second controllable current sink comprises a differential information signal.

13. The integrated circuit of claim 12, wherein:
the first main protection circuit comprises a first attenuator having a first input configured to couple to the first end of the primary winding and a second input coupled to receive a positive input of the differential information signal; and
the second main protection circuit comprises a second attenuator having a first input configured to couple to the second end of the primary winding and a second input coupled to receive a negative input of the differential information signal.

14. The integrated circuit of claim 9, wherein:
the first controllable current sink comprises a first transistor; and
the second controllable current sink comprises a second transistor.

15. The integrated circuit of claim 9, wherein an input signal that drives the first and second controllable current sinks comprises a Power Line Communication (PLC) information signal.

16. An integrated circuit formed inside a chip comprising:
a first transistor formed inside the chip having a gate receiving a first input, a drain providing a first output, and a source coupled to a reference voltage, the first output configured to drive a first end of a primary winding of a transformer that is located outside the chip;
a second transistor formed inside the chip having a gate receiving a second input, a drain providing a second output, and a source coupled to a reference voltage, the second output configured to drive a second end of the primary winding of the transformer that is located outside the chip;
a first main protection circuit formed inside the chip configured to connect in series between the first end of the primary winding of the transformer and the first input of the first transistor; and
a second main protection circuit formed inside the chip configured to connect in series between the second end of the primary winding of the transformer and the second input of the second transistor,
wherein the first and second main protection circuits are configured to limit operations of the first transistor and the second transistor to protect the chip from voltage levels greater than a protection voltage of the chip at the first and second output.

17. The integrated circuit of claim 16, wherein the transformer comprises a center tap that is electrically connected to a voltage of between two to five times greater than a supply voltage of the integrated circuit.

18. The integrated circuit of claim 16, wherein an input signal that drives the first transistor and the second transistor comprises a differential information signal.

19. The integrated circuit of claim 18, wherein:
the first main protection circuit comprises a first attenuator having a first input configured to couple to the first end of the primary winding and a second input coupled to receive a positive input of the differential information signal; and
the second main protection circuit comprises a second attenuator having a first input configured to couple to the second end of the primary winding and a second input coupled to receive a negative input of the differential information signal.

20. The integrated circuit of claim 18, wherein an input signal that drives the first and second transistors comprises a Power Line Communication (PLC) information signal.

* * * * *